(12) United States Patent
Ohama et al.

(10) Patent No.: US 7,299,658 B2
(45) Date of Patent: Nov. 27, 2007

(54) QUARTZ GLASS CRUCIBLE FOR THE PULLING UP OF SILICON SINGLE CRYSTAL

(75) Inventors: Yasuo Ohama, Echizen (JP); Takayuki Togawa, Himeji (JP); Shigeo Mizuno, Echizen (JP)

(73) Assignees: Heraeus Quarzglas GmbH & Co. K.G., Hanau (DE); Shin-Etsu Quartz Products Co. Ltd., Tokyo (JP)

( * ) Notice: Subject to any disclaimer, the term of this patent is extended or adjusted under 35 U.S.C. 154(b) by 32 days.

(21) Appl. No.: 10/559,086

(22) PCT Filed: May 21, 2004

(86) PCT No.: PCT/JP2004/006947

§ 371 (c)(1), (2), (4) Date: Jan. 26, 2006

(87) PCT Pub. No.: WO2004/106247

PCT Pub. Date: Sep. 12, 2004

(65) Prior Publication Data

US 2006/0144327 A1 Jul. 6, 2006

(30) Foreign Application Priority Data

May 30, 2003 (JP) .............................. 2003-154845

(51) Int. Cl.
*C03B 11/08* (2006.01)
*C30B 35/00* (2006.01)

(52) U.S. Cl. .............................. 65/374.11; 65/DIG. 8; 117/200; 117/900

(58) Field of Classification Search ............. 65/374.11, 65/DIG. 8; 117/200, 900
See application file for complete search history.

(56) References Cited

U.S. PATENT DOCUMENTS 5,174,801 A 12/1992 Matsumura et al.

(Continued)

FOREIGN PATENT DOCUMENTS

EP 1 319 736 A1 6/2003

(Continued)

OTHER PUBLICATIONS

Patent Abstracts of Japan, for JP8169798 (Jul. 2, 1996).

(Continued)

*Primary Examiner*—Felisa Hiteshew
(74) *Attorney, Agent, or Firm*—Tiajoloff & Kelly

(57) ABSTRACT

A quartz glass crucible for use in pulling up a silicon single crystal, wherein it has, at least in the curved portion thereof, a three-layer structure comprising a transparent inner layer being composed of a synthetic quartz glass and having a low Al concentration, a transparent or nontransparent intermediate layer being composed of a natural quartz glass or a mixture of natural and synthetic quartz glasses and having a high Al concentration, and a nontransparent outer layer being composed of a natural quartz glass and having an Al concentration higher than that of the intermediate layer. The quartz glass crucible is reduced in the deformation of the transparent inner layer, and allows the suppression of the change in the amount of dissolution of the quartz glass crucible associated with the pull-up of a single crystal and the achievement of the uniform oxygen concentration in the longitudinal direction of a single crystal.

20 Claims, 1 Drawing Sheet

U.S. PATENT DOCUMENTS 6,641,663 B2  11/2003  Kemmochi et al.
2003/0106491 A1  6/2003  Kemmochi et al.

FOREIGN PATENT DOCUMENTS

| JP | 5-105577 | 4/1993 |
| JP | 8-169798 | 7/1996 |
| JP | 11-199368 | 7/1999 |
| JP | 2000-247778 A | 9/2000 |
| JP | 2002-284596 A | 10/2002 |
| JP | 2003-95678 A | 4/2003 |

OTHER PUBLICATIONS

Patent Abstracts of Japan, for JP5105577 (Apr. 27, 1993).
Patent Abstracts of Japan, Sep. 12, 2000, for JP 2000-247778 A.
Patent Abstracts of Japan, Oct. 3, 2002, for JP 2002-284596 A.
Patent Abstracts of Japan, Apr. 3, 2003, for JP 2003-95678 A.
Patent Abstracts of Japan, Jul. 7, 1999, for JP 11-199368 A.

QUARTZ GLASS CRUCIBLE FOR THE PULLING UP OF SILICON SINGLE CRYSTAL

TECHNICAL FIELD

The present invention relates to a quartz glass crucible for the pulling up of silicon single crystals.

BACKGROUND ART

A widely used method in the prior art for the manufacture of silicon single crystals is the so-called Czochralski method (CZ method). This CZ method comprises a step for the melting of polycrystalline silicon in a crucible manufactured from quartz glass, a step for the immersion of a "seed" crystal for the silicon single crystals in this silicon melt, and a step for the rotation of the crucible as the "seed" crystal is gradually pulled up which, with the "seed" crystal serving as a core, results in the growth of silicon single crystals. The silicon single crystals produced by the abovementioned CZ method must be of high purity and must afford the manufacture of a good yield of silicon wafers and, accordingly, generally employed quartz glass crucibles for the manufacture of said comprise a two-layered quartz glass crucible structure configured from a non-foamed transparent inner layer and a foamed non-transparent layer.

Because of the increased time required for the pulling up of silicon single crystals accompanying the increase in the aperture diameter of silicon single crystals that has occurred in recent years, further and increased purity of the quartz glass crucible has come to be demanded. With this in mind, the applicants of this application have previously proposed a crucible of a two-layered quartz glass crucible structure configured from a transparent inner layer and a non-transparent outer layer of which the inner layer is formed from synthetic silica powder (cited document 1). Because of the very low quantity of impurities contained in the inner layer configured from the synthetic quartz glass and, in addition, because there is minimal roughening and formation of cristoballite spots on the crucible surface accompanying the pulling up of the silicon single crystals, this crucible affords an improved yield of pulled up silicon single crystals. This crucible is additionally advantageous in that, because the abovementioned outer layer of the crucible is configured from a high viscosity natural quartz glass of high Al concentration, the likelihood that the crucible will break or buckle or that similar deformation will occur at high heat load can be reduced.

However, there are problems inherent to the use of a crucible configured as a two-layered structure such as that described above in which the transparent inner layer is configured from synthetic quartz glass and the outer layer is configured from natural quartz glass in that, because of a resultant significant increase in heat load produced by the heater that has accompanied the increase in the aperture of the crucible, at times of long contact with the silicon melt and high heat load in particular, warp is generated at the interface between the two layers in the curved portion of a long crucible due to the difference in viscosity that has its origin in differences in Al concentration and, accordingly, warp deformation of the transparent inner layer occurs, large undulations are formed in the crucible inner surface, and yield of the silicon single crystals is reduced.

Meanwhile, although oxygen is present in the silicon single crystals produced using the CZ method, the concentration of this oxygen, which is dependent on the dissolution of the quartz glass crucible in the melt, is governed by the difference between the quantity of the quartz glass crucible ($SiO_2$) that dissolves and the quantity of SiO that evaporates from the surface of the silicon melt. In general, despite the fact that the surface area of the surface of the melt remains essentially unchanged as the pulling up of the single crystal progresses, because the contact surface area with the quartz glass crucible decreases and, accordingly, the dissolved quantity thereof decreases, an oxygen concentration gradient is produced in the length direction of the single crystal. Even if the pulling up of the silicon single crystals is implemented without interference, as this gradient increases an increase in the section in which the oxygen concentration is outside the standard range occurs which produces the undesirable effect of lowered product yield. Although this problem has been addressed in the prior art by increasing the quantity of the quartz glass crucible that dissolves by increasing the number of rotations thereof and, in addition, by raising the pressure in the furnace to decrease the quantity of SiO evaporated from the surface of the melt, the inherent drawback associated with these measures is the increased manufacturing costs caused by the increased complexity of the operations. Although, in order to obviate this drawback, a quartz glass crucible comprising a semi-circular base part in which balance is maintained between the surface area of the melt and the contact surface area between the crucible and the melt has been proposed (cited document 2), there is an inherent drawback associated with this quartz glass crucible in that, because its shape differs from the shape of the flat-base quartz glass crucible of the prior art, significant alterations must be made to the equipment used for the manufacture thereof which results in a substantial increase in manufacturing costs.

Cited document 1: Japanese Patent No. 2811290, Japanese Patent No 2933404

Cited document 2: Japanese Laid-Open Patent Application No. H11-199368

DISCLOSURE OF THE INVENTION

Problems to be Solved by the Invention

As a result of fervent research carried out with the existing condition in mind, the inventors of the present invention discovered that deformation of the transparent inner layer could be easily prevented by the provision in at least the curved portion of the quartz glass crucible for the pulling up of silicon single crystals of a transparent inner layer of low Al concentration, a non-transparent outer layer of high Al concentration and an intermediate layer of Al concentration in-between that of the other two layers. The inventors additionally discovered that, by decreasing the thickness of the abovementioned transparent inner layer of the quartz glass crucible from the lower part to the upper part of the crucible, even when the contact surface area between the quartz glass crucible and the silicon melt decreases, change in the quantity of the quartz glass crucible that dissolves can be suppressed, and oxygen concentration in the length direction of the single crystal can be made uniform, and this led to the completion of the present invention. That is to say:

It is an object of the present invention to provide a quartz glass crucible for the pulling up of silicon single crystals in which little deformation of the transparent inner layer occurs, in which the change in the quantity of the quartz glass crucible that dissolves accompanying the pulling up of the single crystal can be suppressed, and in which the oxygen concentration in the length direction of the single crystal can be made uniform.

Means to Resolve the Problems

The present invention, which achieves the above-noted object, relates to a quartz glass crucible employed for the pulling up of silicon single crystals, which quartz crucible for pulling up silicon single crystals is characterized in that at least the curved portion thereof comprises a three-layered structure of a transparent inner layer configured from synthetic quartz glass of low Al concentration, a transparent or non-transparent intermediate layer configured from natural quartz glass or a blend of natural and a synthetic quartz glass of high Al concentration, and a non-transparent outer layer configured from natural quartz glass of higher Al concentration than the intermediate layer.

The quartz crucible for pulling up of silicon single crystals of the present invention as described above-which constitutes a three-layered structure of which at least the curved portion thereof comprises a transparent inner layer configured from synthetic quartz glass of low Al concentration, a transparent or non-transparent intermediate layer configured from natural quartz glass or a blend of natural and a synthetic quartz glass of high Al concentration, and a non-transparent outer layer configured from natural quartz glass of higher Al concentration than the intermediate layer—preferably comprises a transparent inner layer of Al concentration $C_A$ 0.01 to 1 ppm, a transparent or non-transparent intermediate layer of Al concentration $C_B$ 1 to 8 ppm, and a non-transparent outer layer of Al concentration $C_C$ 5 to 20 ppm. Because the $C_C$ is within the abovementioned range, even at times of high heat load and long pulling up time, break or buckling of the crucible is unlikely to occur. However, deformation of the crucible itself is likely to occur when the $C_C$ is less than 5 ppm and, in addition, when the $C_C$ exceeds 20 ppm, the concentration of the other incidental elements contained with the Al increases which has an undesirable effect on the quality of the silicon single crystals. The Al concentration of the abovementioned transparent inner layer, the transparent or non-transparent intermediate layer configured from natural quartz glass or a blend of natural and synthetic quartz glass, and the non-transparent outer layer configured from natural quartz glass can be adjusted in accordance with need by, by way of example, a method for the blending of Al fine powder with silica powder, a method for the hydrolysis, drying and sintering of an homogeneous solution of a silicon compound and an Al compound and, in addition, a method for coating a silica powder with an Al compound in which a silica powder is immersed in an Al compound solution and then dried. For the manufacture of Al-containing synthetic silica glass in particular, the preferred method for the production of a synthetic quartz glass of the desired Al concentration constitutes, by way of example, a method for, following the addition and uniform blending of a prescribed quantity of aluminium chloride in a silicon tetrachloride solution, the hydrolysis, drying and sintering thereof.

When the quartz glass crucible for the pulling up of silicon single crystals of the present invention is used at conditions of particularly high heat load the formation of a non-transparent outer layer Al concentration $C_C$ of the order of 12 to 20 ppm is required. Because of the increased difference between the $C_A$ and $C_C$ in this case, warp at the interface between the layers can be further alleviated by the formation of the intermediate layer as a transparent layer. On the other hand, at comparatively low heat load, the use of a non-transparent outer layer Al concentration $C_C$ of the order of 5 to 10 ppm facilitates the quick assimilation of the quartz glass crucible with an outer side carbon crucible and, accordingly, a minimizing of the generation of flaws in the initial manufacturing steps. In addition, the intermediate layer is easier to produce because the difference between the $C_A$ and $C_C$ in this case is not significant and, moreover, the formation thereof as a transparent layer is more cost effective.

In addition, in the quartz glass crucible for the pulling up of silicon single crystals of the present invention, the thickness of the transparent inner layer of low Al concentration configured from synthetic quartz glass decreases from the lower part to the upper part of the crucible. More specifically, with respect to the height (H) from the lowermost point of the base part of the crucible main body to the upper end surface of the upright drum part, the average thickness $T_A1$ in the 0 to 0.25 H range should be 0.5 to 3 mm, the average thickness $T_A2$ in the 0.25 to 0.5 H range should be 0.3 to 2 mm, and the average thickness $T_A3$ in the 0.5 to 1 H range should be 0 to 0.9 mm $T_A3$, with $T_A1>T_A2>T_A3$. Furthermore, the thickness of the transparent layer in the 0.25 to 1 H range should be graded in such a way as to decrease gradually towards the upper part. Using a quartz glass crucible for the pulling up of silicon single crystals with a transparent layer of the abovementioned range of thickness almost all of the thickness $T_A3$ dissolves following the dissolution and melting of the polycrystalline silicon, and this leaves the intermediate layer of higher Al concentration—which dissolves less readily in a melt—exposed. As a result, the oxygen concentration of the silicon single crystals is governed by the quantity of the transparent inner layer of the lower part of the crucible that dissolves, and change in the quantity of the crucible that dissolves accompanying the motion of the silicon single crystals can be suppressed. In addition, by the grading of the thickness of the transparent inner layer so that $T_A1>T_A2>T_A3$, the exposure of the intermediate layer can be easily controlled and, in addition, constancy of the quantity of the crucible that dissolves can be maintained. In addition, by the adoption of an intermediate layer thickness of 0.8 to 5 mm which is 10 to 40% of the total thickness, the function thereof as a section in which deformation is alleviated can be optimized.

EFFECT OF THE INVENTION

The present invention, which constitutes a three-layered structure in which, in at least the curved portion thereof, a transparent inner layer of low Al concentration, a non-transparent outer layer of high Al concentration, and an intermediate layer between said layers of Al concentration in-between that of the other two layers are provided, preferably constitutes a quartz glass crucible for the pulling up of silicon single crystals in which the thickness of the transparent inner layer decreases from the lower part to the upper part of the crucible. Using the quartz glass crucible for the pulling up of silicon single crystals of the present invention of the abovementioned structure, little deformation of the transparent inner layer occurs at times of high heat load and, in addition, even when the contact surface area with the silicon melt decreases, change in the quantity of the quartz glass crucible that dissolves can be suppressed, the oxygen concentration in the length direction of the single crystal can be uniformly maintained and, accordingly, silicon single crystals of high crystallization rate can be pulled out.

BEST MODE FOR CARRYING OUT THE INVENTION

FIG. 1 shows the quartz glass crucible for the pulling up of silicon single crystals of the present invention. The symbol 1 denotes the quartz glass crucible, 2 denotes the base part of the crucible, 3 denotes the upright drum part of the crucible, 4 denotes a non-transparent layer configured from natural quartz glass, 5 denotes a transparent or non-transparent intermediate layer configured from natural quartz glass or a blend of natural and synthetic quartz glass, 6 denotes a transparent inner layer configured from synthetic quartz glass, and 7 denotes a curved portion. FIG. 2 shows a device for the manufacture of the abovementioned quartz glass crucible. In FIG. 2, the symbol 8 denotes a rotating mold, 9 denotes the crucible main body, 10, 15 denote a silica powder supply means, 11 denotes a disk-shaped cover, 12 denotes a flow regulator valve, 13 denotes a power source, 14 denotes an arc electrode, and 16 denotes a high-temperature atmosphere. Although the quartz glass crucible for the pulling up of silicon single crystals of the present invention is manufactured by the introduction of natural silica powder into the rotating mold 8 which is molded into a crucible shape, the insertion therein of the arc electrode 14, the covering of the opened part of the crucible-shaped body by the disk-shaped cover 11, and the creation of a high-temperature gas atmosphere in the inner cavity of the crucible-shaped body by the arc electrode 14 to produce at least a partially molten glass from which the non-transparent crucible substrate 9 is formed, followed by a subsequent adjustment of the flow from the silica powder supply means 10 by the flow regulator valve 12 to supply to the high-temperature atmosphere 16 a natural or natural-synthetic blend silica powder which forms the molten glass from which the transparent or non-transparent layer is formed, and then the supply from the silica powder supply means 15 to the high-temperature atmosphere 16 of synthetic silica powder which forms the molten glass from which the transparent layer configured from synthetic quartz glass is formed, at this time, in such a way that the thickness of the transparent inner layer with respect to the height (H) from the lowermost point of the base part of the crucible main body to the upper end surface of the upright drum part is an average thickness $T_A1$ of 0.5 to 3 mm in the 0 to 0.25 H range, an average thickness $T_A2$ of 0.3 to 2 mm in the 0.25 to 0.5 H range, and an average thickness $T_A3$ of 0 to 0.9 mm in the 0.5 to 1 H range $T_A3$ and $T_A1 > T_A2 > T_A3$, the thickness from the lower part to the upper part of the transparent inner layer decreases.

WORKING EXAMPLE 1

Employing the device shown in FIG. 2, a refined high-purity natural silica powder was introduced into the rotating mold 8 and, by the centrifugal forces thereof, was moulded into the shape of the quartz glass crucible, the arc electrode 14 was then inserted therein, the opening part was covered with the disk-shaped cover 11, and a high-temperature gas atmosphere was created in the inner cavity by the arc electrode 14 resulting in the formation of a molten glass which was then cooled to produce the non-transparent quartz glass crucible-shaped molded body 9. Next, with the mold 8 rotating, a high-temperature atmosphere 16 was created in the inner cavity of the transparent quartz glass crucible-shaped molded body 9 by the arc electrode 14, natural silica powder was then supplied from the silica powder supply means 10 at 100 g/min, and the natural quartz glass transparent intermediate layer 5 of thickness 2 mm was integrally-fused with the inner surface of the non-transparent quartz glass crucible-shaped molded body 9. Next, the synthetic silica powder from the silica powder supply means 15, of which the flow thereof was controlled to 100 g/min by the flow regulator valve 12, was integrally-fused in a total thickness of 14 mm with the inner surface of the abovementioned intermediate layer producing a $T_A1$ of 1.5 mm, $T_A2$ of 1 mm and $T_A3$ of 0.3 mm. A 24-inch diameter quartz glass crucible for the pulling up of silicon single crystals with a $C_A$ of 0.02 ppm, $C_B$ of 6 ppm and $C_C$ of 14 ppm was produced. In the actual use of this quartz glass crucible, the average single crystal conversion rate following the packing and melting of polycrystalline silicon and the pulling up of a single crystal based on the CZ method 5 times was 94%, and the oxygen concentration distribution in the single crystal was uniform.

WORKING EXAMPLE 2

Apart from the alteration of the $T_A1$, $T_A2$, $T_A3$ of working example 1 to 1.5 mm, a 24-inch quartz glass crucible for the pulling up of silicon single crystals identical to that of working example 1 was produced. The $C_A$ of said crucible was 0.02 ppm, the $C_B$ was 6 ppm, and the $C_C$ was 14 ppm. Although, in the actual use of this quartz glass crucible, the average single crystal conversion rate following the packing and melting of polycrystalline silicon and the pulling up of a single crystal based on the CZ method 5 times was a high yield of 95%, the oxygen concentration toward the upper side of the single crystal was high and was only just within the advised standard.

COMPARATIVE EXAMPLE 1

Apart from the absence in the quartz glass crucible of the natural transparent intermediate layer of working example 2, a 24-inch quartz glass crucible for the pulling up of silicon single crystals identical to that of working example 2 was produced. The $C_A$ of said crucible was 0.02 ppm, and the $C_C$ thereof was 14 ppm. In the actual use of this quartz glass crucible, the average single crystal conversion rate following the packing and melting of polycrystalline silicon and the pulling up of a single crystal based on the CZ method 5 times was a low 78%, and observation of the quartz glass crucible following its use revealed warp deformation in the transparent layer of the curved portion.

WORKING EXAMPLE 3

Employing the device shown in FIG. 2, a refined high-purity natural silica powder was introduced into the rotating mold 8 and, by the centrifugal forces thereof, was molded into the quartz glass crucible molded shape, a natural silica powder was further introduced into the mold and, by the centrifugal forces thereof, was molded into an approximately 3 mm natural-synthetic blend silica layer, the arc electrode 14 was then inserted therein, the opening part was covered with the disk-shaped cover 11, and a high-temperature gas atmosphere was created in the inner cavity by the arc electrode 14 resulting in the formation of a molten glass which was then cooled to form the non-transparent quartz glass crucible-shaped molded body 9 configured from an approximately 2 mm natural-synthetic blend quartz glass layer and a natural quartz glass layer on the outer side thereof. Next, with the mold 8 rotating, the inner cavity of the non-transparent quartz glass crucible-shaped molded body 9 was formed as a high-temperature atmosphere 16 by the arc electrode 14, following which the synthetic silica powder, of which the flow thereof was controlled by the flow regulator valve, was supplied from the silica powder supply means 10 at 100 g/min and integrally-fused in a total thickness of 12 mm with the inner surface of the above-mentioned molded body 9 producing a $T_A1$ of 2.8 mm, $T_A2$ of 2 mm and $T_A3$ of 0.8 mm. A 22-inch diameter quartz glass crucible for the pulling up of silicon single crystals with a $C_A$ of 0.03 ppm, $C_B$ of 2 ppm and $C_C$ of 7 ppm was produced. In the actual use of this quartz glass crucible, the average single crystal conversion rate following the packing and melting of polycrystalline silicon and the pulling up of a single crystal based on the CZ method 5 times was 93%, and the oxygen concentration distribution in the single crystal was uniform.

COMPARATIVE EXAMPLE 2

Apart from the absence in the quartz glass crucible of the natural transparent intermediate layer of working example 3, a 22-inch quartz glass crucible for the pulling up of silicon single crystals identical to that of working example 3 was produced. The $C_A$ of said crucible was 0.03 ppm, and the $C_C$ thereof was 7 ppm. In the actual use of this quartz glass crucible, the average single crystal conversion rate following the packing and melting of polycrystalline silicon and the pulling up of a single crystal based on the CZ method 5 times was a low 83%, and observation of the quartz glass crucible following its use revealed signs of deformation in the transparent layer of the curved portion.

INDUSTRIAL APPLICABILITY

Because little deformation of the transparent inner layer occurs, change in the quantity of the quartz glass crucible that dissolves accompanying the pulling up of the single crystal can be suppressed, and the oxygen concentration in the length direction of the single crystal can be made uniform, the invention is useful for the pulling of large single crystals.

EXPLANATION OF SYMBOLS

Figure 1:
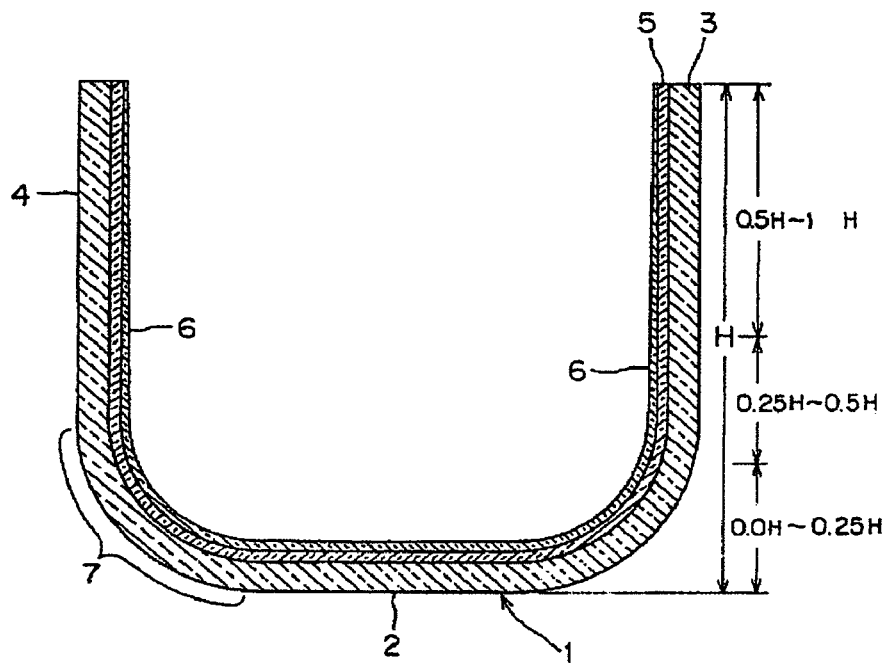
FIG. 1 is a schematic cross-sectional diagram of the quartz glass crucible for the pulling up of silicon single crystals of the present invention.
Figure 2:
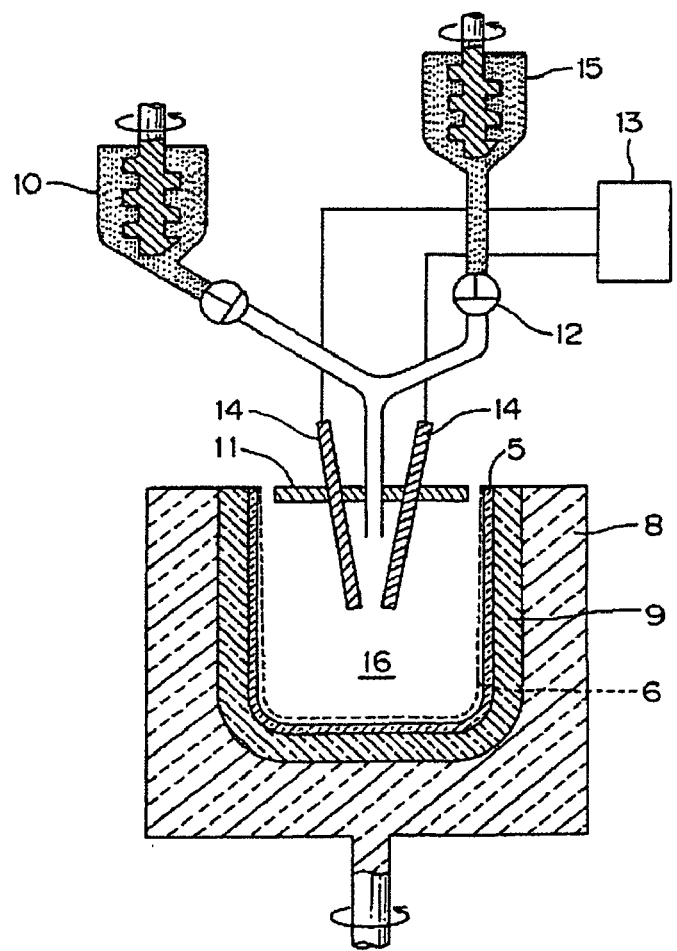
FIG. 2 is a schematic diagram of the manufacturing device for the manufacture of the above-noted quartz glass crucible for the pulling up of silicon single crystals.

1: Quartz glass crucible for the pulling up of silicon single crystals
2: Base part
3: Upright drum part
4: Non-transparent layer configured from natural quartz glass
5: Transparent or non-transparent layer configured from natural quartz glass or a blend of natural and synthetic quartz glass.
6: Transparent layer configured from synthetic quartz glass
7: Curved portion
8: Rotating mold
9: Crucible-shaped molded body
10, 15: Silica powder supply means
11: Plate-shaped cover
12: Flow regulator valve
13: Power source
14: Arc electrode
16: High-temperature atmosphere

The invention claimed is:

1. A quartz glass crucible for pulling up silicon single crystals, comprising: a curved portion, having a three-layered structure, the three-layered structure having a transparent inner layer of synthetic quartz glass with a first Al concentration, an intermediate layer of natural quartz glass or a blend of natural and synthetic quartz glass, having a second Al concentration higher than the first Al concentration, and a non-transparent outer layer of natural quartz glass having a third Al concentration higher than the second Al concentration, wherein the transparent inner layer has a thickness that decreases from a lower part to an upper part of the quartz glass crucible.

2. The quartz crucible of claim 1, wherein the Al concentration of the transparent inner layer is less than 1 ppm.

3. The quartz crucible of claim 2, wherein the Al concentration of the intermediate layer is 1 to 8 ppm.

4. The quartz crucible of claim 3, wherein, with respect to a height (H) from a lowermost end of a base part of the crucible to an upper end surface of an upright drum part of the crucible, the transparent inner layer has an average thickness $T_A1$ of 0.5 to 3 mm from 0 to 0.25 H, an average thickness $T_A2$ of 0.3 to 2 mm from 0.25 H to 0.5 H, and an average thickness $T_A3$ of 0 to 0.9 mm from 0.5 H to 1 H, wherein $T_A1>T_A2>T_A3$.

5. The quartz crucible of claim 4, wherein the average thickness $T_A2$ and $T_A3$ of the transparent inner layer from 0.25 H to 1 H decreases gradually in a direction toward the upper part thereof.

6. The quartz crucible of claim 2, wherein, with respect to a height (H) from a lowermost end of a base part of the crucible to an upper end surface of an upright drum part of the crucible, the transparent inner layer has an average thickness $T_A1$ of 0.5 to 3 mm from 0 to 0.25 H, an average thickness $T_A2$ of 0.3 to 2 mm from 0.25 H to 0.5 H, and an average thickness $T_A3$ of 0 to 0.9 mm from 0.5 H to 1 H, wherein $T_A1>T_A2>T_A3$.

7. The quartz crucible of claim 6, wherein the average thickness $T_A2$ and $T_A3$ of the transparent inner layer from 0.25 H to 1H decreases gradually in a direction toward the upper part thereof.

8. The quartz crucible of claim 1, wherein, with respect to a height (H) from a lowermost end of a base part of the crucible to an upper end surface of an upright drum part of the crucible, the transparent inner layer has an average thickness $T_A1$ from 0 to 0.25 H, an average thickness $T_A2$ from 0.25 H to 0.5 H, and an average thickness $T_A3$ from 0.5 H to 1 H, wherein $T_A1>T_A2>T_A3$.

9. The quartz crucible of claim 8, wherein the average thickness $T_A2$ and $T_A3$ of the transparent inner layer from 0.25 H to 1H decreases gradually in a direction toward the upper part thereof.

10. A quartz crucible for pulling silicon single crystals comprising: a curved portion, having a three-layered structure, the three-layered structure having a transparent inner layer of synthetic quartz glass of low Al concentration, an intermediate layer of natural quartz glass or a blend of natural and synthetic quartz glass, having a high Al concentration, and a non-transparent outer layer of natural quartz glass having a higher Al concentration than the intermediate layer, wherein the transparent inner layer has a thickness that decreases from a lower part to an upper Part of the quartz glass crucible, wherein the Al concentration of the transparent inner layer is 0.01 to 1 ppm, the Al concentration of the intermediate layer is 1 to 8 ppm, and then Al concentration of the non-transparent outer layer is 5 to 20 ppm.

11. The quartz crucible of claim 10, wherein the intermediate layer is transparent and the Al concentration of the intermediate layer is 4 to 8 ppm, and the Al concentration of the non-transparent outer layer is 12 to 20 ppm.

12. The quartz crucible for pulling up silicon single crystals as claimed in claim 11, wherein, with respect to a height (H) from a lowermost end of a base part of the crucible to an upper end surface of an upright drum part of the crucible, the transparent inner layer has an average thickness $T_A1$ of 0.5 to 3 mm from 0 to 0.25 H, an average thickness $T_A2$ of 0.3 to 2 mm from 0.25 H to 0.5 H, and an average thickness $T_A3$ of 0 to 0.9 mm from 0.5 H to 1 H, wherein $T_A1 > T_A2 > T_A3$.

13. The quartz crucible of claim 12, wherein the average thickness $T_A2$ and $T_A3$ of the transparent inner layer from 0.25 H to 1H decreases gradually in a direction toward the upper part thereof.

14. The quartz crucible of claim 10, wherein the intermediate layer is non-transparent and the Al concentration of the intermediate layer is 1 to 3 ppm, and the Al concentration of the non-transparent outer layer is 5 to 10 ppm.

15. The quartz crucible for pulling up silicon single crystals as claimed in claim 14, wherein, with respect to a height (H) from a lowermost end of a base part of the crucible to an upper end surface of an upright drum part of the crucible, the transparent inner layer has an average thickness $T_A1$ of 0.5 to 3 mm from 0 to 0.25 H, an average thickness $T_A2$ of 0.3 to 2 mm from 0.25 H to 0.5 H, and an average thickness $T_A3$ of 0 to 0.9 mm from 0.5 H to 1 H, wherein $T_A1 > T_A2 > T_A3$.

16. The quartz crucible of claim 15, wherein the average thickness $T_A2$ and $T_A3$ of the transparent inner layer from 0.25 H to 1H decreases gradually in a direction toward the upper part thereof.

17. The quartz crucible of claim 10, wherein, with respect to a height (H) from a lowermost end of a base part of the crucible to an upper end surface of an upright drum part of the crucible, the transparent inner layer has an average thickness $T_A1$ of 0.5 to 3 mm from 0 to 0.25 H, an average thickness $T_A2$ of 0.3 to 2 mm from 0.25 H to 0.5 H, and an average thickness $T_A3$ of 0 to 0.9 mm from 0.5 H to 1 H, wherein $T_A1 > T_A2 > T_A3$.

18. The quartz crucible of claim 17, wherein the average thickness $T_A2$ and $T_A3$ of the transparent inner layer from 0.25 H to 1H decreases gradually in a direction toward the upper part thereof.

19. A quartz crucible for pulling silicon single crystals as comprising: a curved portion, having a three-layered structure, the three-layered structure having a transparent inner layer of synthetic quartz glass of low Al concentration, an intermediate layer of natural quartz glass or a blend of natural and synthetic quartz glass, having a high Al concentration, and a non-transparent outer layer of natural quartz glass having a higher Al concentration than the intermediate layer, wherein the transparent inner layer has a thickness that decreases from a lower part to an upper part of the quartz glass crucible, wherein, with respect to a height (H) from a lowermost end of a base part of the crucible to an upper end surface of an upright drum part of the crucible, the transparent inner layer has an average thickness $T_A1$ of 0.5 to 3 mm from 0 to 0.25H, an average thickness $T_A2$ of 0.3 to 2 mm from 0.25 H to 0.5 H, and an average thickness $T_A3$ of 0 to 0.9 mm from 0.5 H to 1 H, wherein $T_A1 > T_A2 > T_A3$.

20. The quartz crucible of claim 19, wherein the average thickness $T_A2$ and $T_A3$ of the transparent inner layer from 0.25H to 1H decreases gradually in a direction toward the upper part thereof.

* * * * *